(12) United States Patent
Kuo

(10) Patent No.: US 11,631,631 B2
(45) Date of Patent: Apr. 18, 2023

(54) SEMICONDUCTOR DEVICE INCLUDING VIA STRUCTURE FOR VERTICAL ELECTRICAL CONNECTION

(71) Applicant: Advanced Semiconductor Engineering, Inc., Kaohsiung (TW)

(72) Inventor: Chin-Cheng Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/334,571

(22) Filed: May 28, 2021

(65) Prior Publication Data

US 2022/0384310 A1 Dec. 1, 2022

(51) Int. Cl.
*H01L 23/48* (2006.01)
*H01L 21/768* (2006.01)
*H01L 23/00* (2006.01)

(52) U.S. Cl.
CPC ...... *H01L 23/481* (2013.01); *H01L 21/76898* (2013.01); *H01L 24/05* (2013.01); *H01L 2224/05025* (2013.01)

(58) Field of Classification Search
CPC .................... H01L 23/481; H01L 21/76898
See application file for complete search history.

(56) References Cited

U.S. PATENT DOCUMENTS

| | | | |
|---|---|---|---|
| 7,741,152 B2 | 6/2010 | Huang et al. | |
| 10,656,738 B1 * | 5/2020 | Ho | G06F 3/0445 |
| 11,289,402 B2 * | 3/2022 | Park | H01L 23/481 |
| 2004/0259292 A1 | 12/2004 | Beyne et al. | |
| 2005/0087853 A1 | 4/2005 | Okumura et al. | |
| 2006/0091431 A1 | 5/2006 | Kanzawa | |
| 2008/0230912 A1 * | 9/2008 | Lee | H01L 25/0657 257/E21.597 |
| 2009/0026614 A1 * | 1/2009 | Jung | H01L 25/0657 257/738 |
| 2009/0160051 A1 * | 6/2009 | Lee | H01L 23/481 257/E21.597 |
| 2012/0286430 A1 * | 11/2012 | Kraft | H01L 21/76898 257/E21.597 |
| 2013/0020468 A1 * | 1/2013 | Mitsuhashi | H01L 27/14634 257/E21.585 |
| 2013/0221539 A1 * | 8/2013 | Kraft | H01L 21/486 257/774 |
| 2014/0035164 A1 * | 2/2014 | Moon | H01L 23/481 257/774 |

(Continued)

FOREIGN PATENT DOCUMENTS

DE 102010045055 A1 * 3/2012 ........... H01L 21/486

OTHER PUBLICATIONS

Non-Final Office Action for U.S. Appl. No. 17/334,569, dated Feb. 2, 2023, 13 pages.

*Primary Examiner* — Mamadou L Diallo
(74) *Attorney, Agent, or Firm* — Foley & Lardner LLP

(57) ABSTRACT

A semiconductor device and a method for manufacturing the same are provided. The semiconductor device includes a semiconductor substrate, a conductive structure and at least one via structure. The conductive structure is disposed on an upper surface of the semiconductor substrate. The at least one via structure is disposed in the semiconductor substrate. A portion of the at least one via structure extends beyond the conductive structure.

16 Claims, 13 Drawing Sheets

(56) References Cited

U.S. PATENT DOCUMENTS

| | | | |
|---|---|---|---|
| 2014/0191413 A1* | 7/2014 | Minixhofer | H01L 21/76802 |
| | | | 438/666 |
| 2015/0129942 A1* | 5/2015 | Kao | H01L 27/14636 |
| | | | 257/292 |
| 2015/0131323 A1* | 5/2015 | Tsai | G02B 6/0068 |
| | | | 264/1.24 |
| 2015/0137387 A1* | 5/2015 | Choi | H01L 25/0657 |
| | | | 257/774 |
| 2017/0040374 A1* | 2/2017 | Oh | H01L 21/187 |
| 2018/0122749 A1 | 5/2018 | Lee et al. | |
| 2019/0363079 A1* | 11/2019 | Thei | H01L 24/03 |
| 2020/0235038 A1* | 7/2020 | Adusumilli | G02B 6/30 |
| 2020/0273723 A1* | 8/2020 | Lee | H01L 23/481 |
| 2020/0343434 A1* | 10/2020 | Rubin | H01L 23/481 |
| 2020/0395350 A1* | 12/2020 | Wu | H01L 24/29 |
| 2021/0305164 A1* | 9/2021 | Tseng | H01L 23/5384 |
| 2021/0375721 A1* | 12/2021 | Chen | H01L 21/76898 |
| 2021/0375856 A1* | 12/2021 | Alcorn | H01L 21/8258 |
| 2022/0014176 A1* | 1/2022 | Lan | H01L 21/76898 |
| 2022/0084885 A1* | 3/2022 | Han | H01L 24/05 |
| 2022/0093461 A1* | 3/2022 | Chung | H01L 21/76898 |
| 2022/0246567 A1* | 8/2022 | Lin | H01L 23/5226 |

* cited by examiner

SEMICONDUCTOR DEVICE INCLUDING VIA STRUCTURE FOR VERTICAL ELECTRICAL CONNECTION

BACKGROUND

1. Field of the Disclosure

The present disclosure relates to a semiconductor device and a manufacturing method, and to a semiconductor device including at least one via structure for vertical electrical connection, and a method for manufacturing the semiconductor device.

2. Description of the Related Art

In the current semiconductor device, through vias may be used to perform vertical electrical connections with a wiring structure. However, a leakage current issue may exist between the through vias and the wiring structure due to the improper layer-to-layer distance.

Grinding and drilling processes are often used to form the through vias on a base material. Especially, the grinding process is applied on the base material before the formation of the through vias. This may easily cause the base material to crack because the structural strength of the base material is weak at this point in time, thereby decreasing a yield of the semiconductor device.

SUMMARY

In some embodiments, a semiconductor device includes a semiconductor substrate, a conductive structure and at least one via structure. The conductive structure is disposed on an upper surface of the semiconductor substrate. The at least one via structure is disposed in the semiconductor substrate. A portion of the at least one via structure extends beyond the conductive structure.

In some embodiments, a semiconductor device includes a semiconductor substrate, a conductive structure and at least one via structure. The semiconductor substrate defines at least one through hole extending through the semiconductor substrate. The conductive structure is disposed on an upper surface of the semiconductor substrate. The conductive structure defines at least one opening extending through the conductive structure and in communication with the at least one through hole of the semiconductor substrate. A width of the at least one opening of the conductive structure is greater than a width of the at least one through hole of the semiconductor substrate. The at least one via structure is disposed in the through hole of the semiconductor substrate.

In some embodiments, a method for manufacturing a semiconductor device includes: (a) providing a semiconductor substrate and a conductive structure disposed on an upper surface of the semiconductor substrate; (b) forming at least one via structure in the semiconductor substrate and extending beyond the conductive structure; and (c) thinning the semiconductor substrate to expose a portion of the at least one via structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
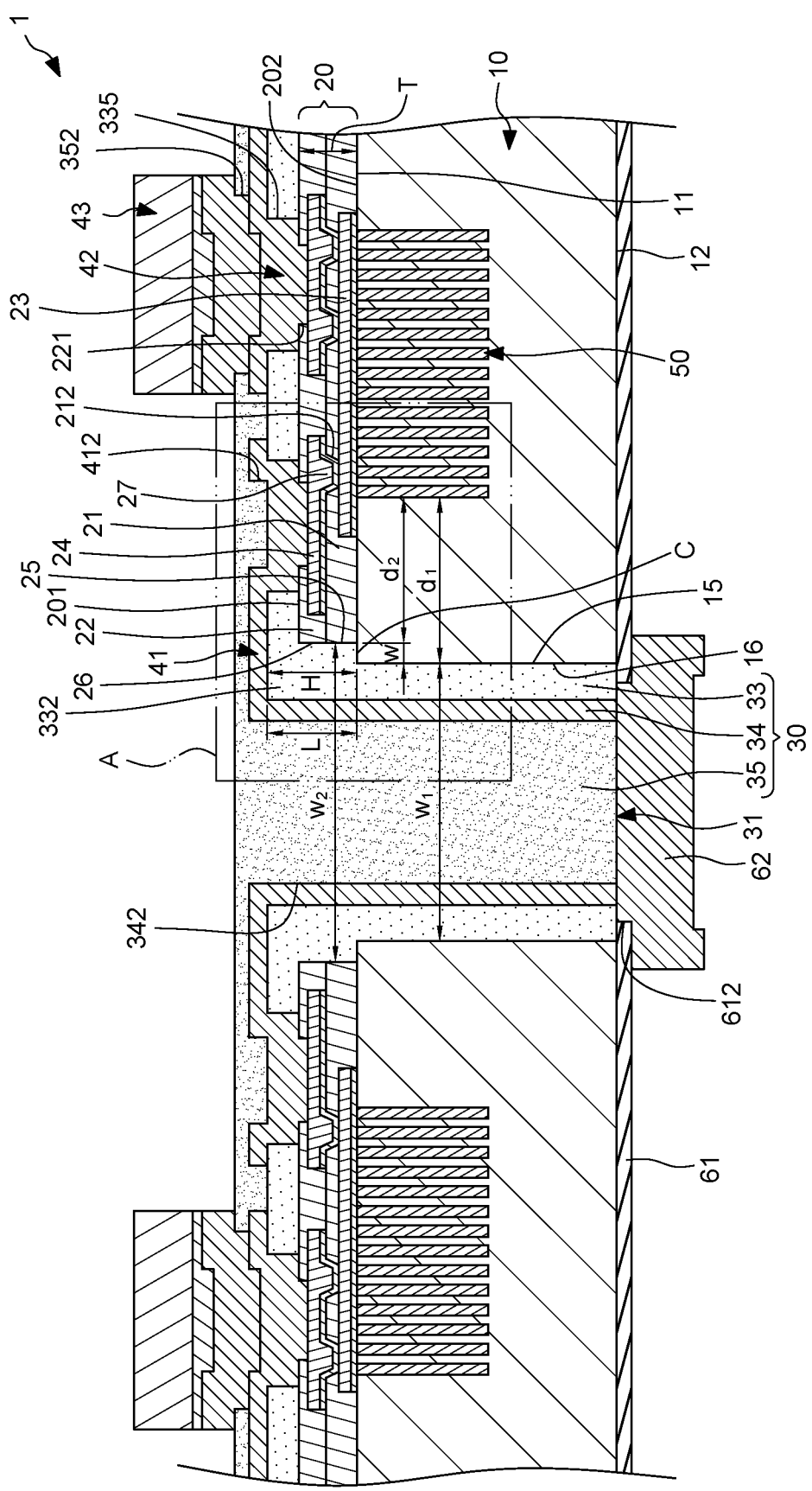
FIG. 1 illustrates a cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a semiconductor device which may solve the leakage current issue and improve a yield of the semiconductor device. In some embodiments, the semiconductor device includes at least one via structure extending beyond a conductive structure. At least some embodiments of the present disclosure further provide for techniques for manufacturing the semiconductor device to prevent a semiconductor substrate from cracking.

Figure 2:
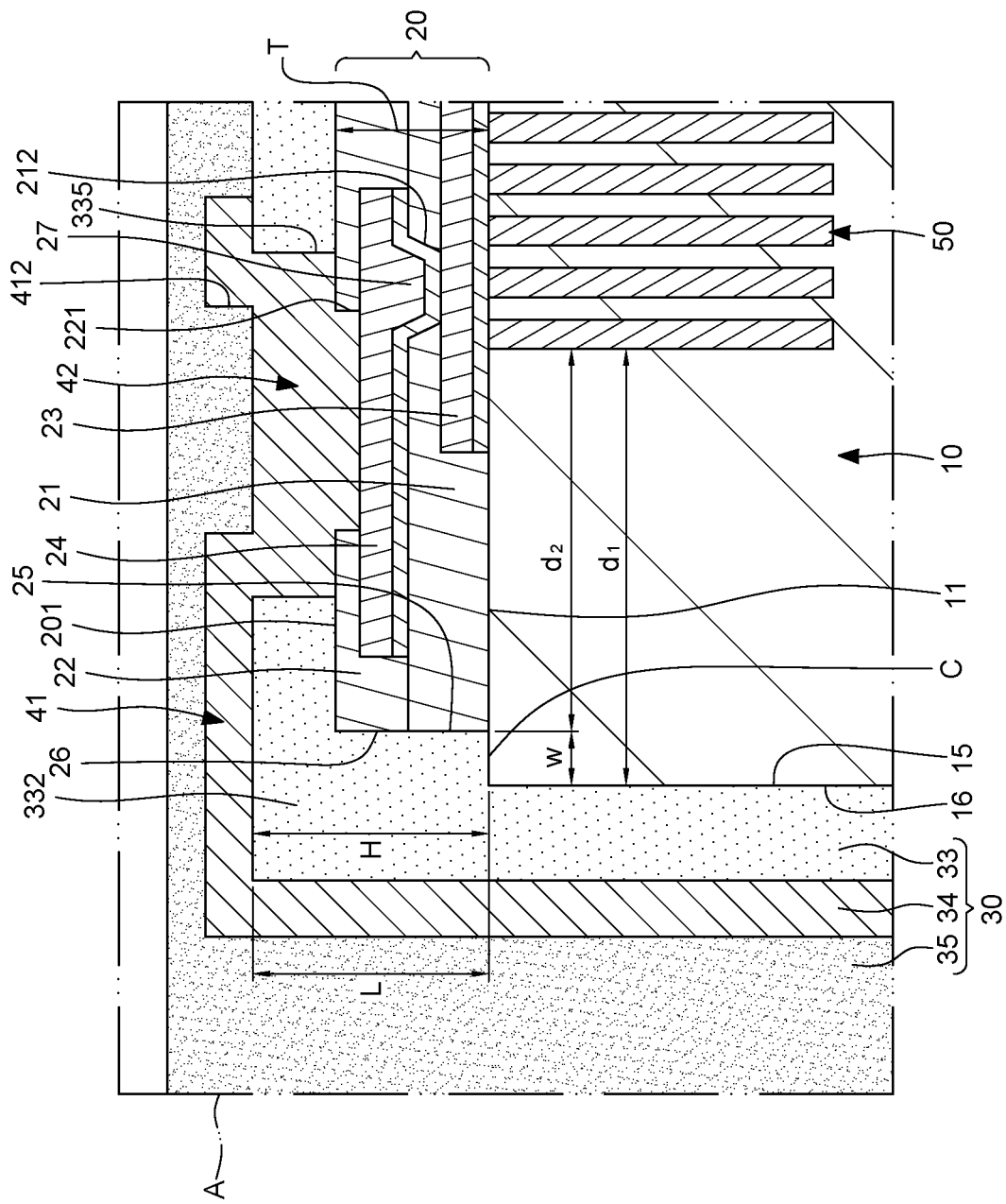
FIG. 2 illustrates an enlarged view of a region "A" in FIG. 1.

FIG. 1 illustrates a cross-sectional view of a semiconductor device 1 according to some embodiments of the present disclosure. FIG. 2 illustrates an enlarged view of a region "A" in FIG. 1. The semiconductor device 1 includes a semiconductor substrate 10, a conductive structure 20, at least one via structure 30, a conductive layer 41, at least one interconnection via 42, at least one metal bump 43, at least one electrical component 50, a protection layer 61 and at least one connecting pad 62. In some embodiments, the semiconductor device 1 may be a photonic-electronic hybrid semiconductor device.

The semiconductor substrate 10 may be, for example, a semiconductor wafer. The semiconductor substrate 10 has an upper surface 11 and a lower surface 12 opposite to the upper surface 11, and defines at least one through hole 15 extending through the semiconductor substrate 10. In some embodiments, a material of the semiconductor substrate 10 may include silicon.

The conductive structure 20 is disposed on the upper surface 11 of the semiconductor substrate 10. The conductive structure 20 may include at least one passivation layer (including, for example, a first passivation layer 21 and a second passivation layer 22) disposed on the upper surface 11 of the semiconductor substrate 10, at least one circuit layer (including, for example, a first circuit layer 23 and a second circuit layer 24) in contact with the at least one passivation layer (including, for example, the first passivation layer 21 and the second passivation layer 22), and a plurality of inner conductive vias 27. The conductive structure 20 may define at least one opening 25 extending through the conductive structure 20 and in communication with the at least one through hole 15 of the semiconductor substrate 10. That is, the at least one opening 25 of the conductive structure 20 may align with the at least one through hole 15 of the semiconductor substrate 10. In some embodiments, the at least one through hole 15 of the semiconductor substrate 15 may overlap a downward projection area of the at least one opening 25 of the conductive structure 20. In addition, the at least one through hole 15 of the semiconductor substrate 15 and the at least one opening 25 of the conductive structure 20 may be formed by one etching process.

The conductive structure 20 has a top surface 201 and a bottom surface 202 opposite to the top surface 201. An inner wall 26 of the at least one opening 25 may extend between the top surface 201 and the bottom surface 202. In some embodiments, as shown in FIG. 1, a size (e.g., a width $W_2$ or a diameter) of the at least one opening 25 of the conductive structure 20 may be greater than a size (e.g., a width $W_1$ or a diameter) of the at least one through hole 15 of the semiconductor substrate 10. In addition, the at least one opening 25 of the conductive structure 20 may expose a portion of the upper surface 11 of the semiconductor substrate 10. Thus, the exposed portion of the upper surface 11 of the semiconductor substrate and the inner wall 26 of the at least one opening 25 may define a recession C. During etching process, an etching back effect may be caused by anisotropic etching, thus, the size (e.g., the width $W_2$) of the at least one opening 25 is greater than the size (e.g., the width $W_1$) of the at least one through hole 15 so as to form the recession C. In some embodiments, a width W of the recession C may be about 1 μm to about 3 μm. That is, the width $W_2$ of the at least one opening 25 may be greater than the width $W_1$ of the at least one through hole 15 by at least about 2 μm to about 6 μm.

In some embodiments, the conductive structure 20 may include a plurality of passivation layers (including, for example, the first passivation layer 21 and the second passivation layer 22). As shown in FIG. 1, the passivation layers (including, for example, the first passivation layer 21 and the second passivation layer 22) are stacked on one another. For example, the second passivation layer 22 may be disposed on the first passivation layer 21. In some embodiments, a material of each of the passivation layers (including, for example, the first passivation layer 21 and the second passivation layer 22) may include, for example, oxide (e.g., silicon oxide) or nitride (e.g., silicon nitride).

The conductive structure 20 may include a plurality of circuit layers (including, for example, the first circuit layer 23 and the second circuit layer 24). In some embodiments, the first circuit layer 23 is embedded in the first passivation layer 21. The second circuit layer 24 is embedded between the first passivation layer 21 and the second passivation layer 22. As shown in FIG. 1, the first circuit layer 23 is covered by the first passivation layer 21, and the second circuit layer 24 is covered by the second passivation layer 22. In some embodiments, the at least one circuit layer (including, for example, the first circuit layer 23 and the second circuit layer 24) may be spaced apart from the at least one opening 25 and the recession C.

In some embodiments, as shown in FIG. 1, the first passivation layer 21 may define at least one via hole 212 extending through the first passivation layer 21 to expose a portion of the first circuit layer 23. The second passivation layer 22 may define at least one opening 221 extending through the second passivation layer 22 to expose a portion of the second circuit layer 24. The inner conductive vias 27 are disposed in the via hole(s) 212 of the first passivation layer 21 and between the first circuit layer 23 and the second circuit layer 24 for electrically connecting the first circuit layer 23 (e.g., the exposed portion of the first circuit layer 23) and the second circuit layer 24. In some embodiments, each inner conductive via 27 may taper downward.

The at least one via structure 30 is disposed in the at least one through hole 15 of the semiconductor substrate 10 and the at least on opening 25 of the conductive structure 20. Thus, the at least one via structure 30 may extend through the semiconductor substrate 10 and the conductive structure 20. In some embodiments, a bottom surface 31 of the at least one via structure 30 may be substantially coplanar with the lower surface 12 of the semiconductor substrate 10, and a portion of the at least one via structure 30 may extend beyond the conductive structure 20 (including, for example, the passivation layer 21, the second passivation layer 22, the first circuit layer 23 and the second circuit layer 24). The at least one via structure 30 may include a first insulation material 33, an interconnection metal 34 and a second insulation material 35. The first insulation material 33 is disposed in the at least one through hole 15 of the semiconductor substrate 10 and covers a side wall 16 of the at least one through hole 15. Thus, the first insulation material 33 may extend through the semiconductor substrate 10. The first insulation material 33 may be formed from a dry film (e.g., a negative photoresist), a silicon oxide, a silicon nitride, polyimide (PI), polyamide (PA), or polypropylene (PP). The first insulation material 33 may include a height compensation portion 332 protruding from the upper surface 11 of the semiconductor substrate 10. The height compensation portion 332 may contact and cover the exposed portion of the upper surface 11 of the semiconductor substrate 10, and may cover the inner wall 26 of the at least one opening 25 of the conductive structure 20. That is, the height compensation portion 332 may cover the recession C to shield the exposed portion of the upper surface 11 of the semiconductor substrate 10 so as to reduce a risk of the leakage of electricity. In some embodiments, the height compensation portion 332 may extend on the top surface 201 of the conductive structure 20. That is, a height H of the height compensation portion 332 may be greater than a thickness T of the conductive structure 20. In some embodiments, the height H of the height compensation portion 332 may be about 10 μm to about 20 μm.

The first insulation material 33 may surround or may be disposed around the interconnection metal 34. The interconnection metal 34 may be formed from copper or alloy. A height of the interconnection metal 34 is equal to a height of the first insulation material 33. That is, the interconnection metal 34 extends between a top surface of the first insulation material 33 and a bottom surface of the first insulation material 33. In some embodiments, as shown in FIG. 1, the interconnection metal 34 may cover the height compensation portion 332 of the first insulation material 33. Thus, a length L of the interconnection metal 34 extending beyond the upper surface 11 of the semiconductor substrate 10 may be greater than the thickness T of the conductive structure 20. The interconnection metal 34 may define a central hole 342, and the second insulation material 35 fills the central hole 342 defined by the interconnection metal 34 and covers the interconnection metal 34. The second insulation material 35 may be formed from a dry film, a silicon oxide, a silicon nitride, polyimide (PI), polyamide (PA), or polypropylene (PP). The material of the second insulation material 35 may be same as or different from the material of the first insulation material 33.

The conductive layer 41 (e.g., a metal layer) is disposed on the height compensation portion 332 of the first insulation material 33 to electrically connect the interconnection metal 34 of the at least one via structure 30 and the conductive structure 20. The conductive layer 41 (e.g., the metal layer) may be electrically connected to the conductive structure 20 (e.g., the exposed portion of the second circuit layer 24) through the at least one interconnection via 42. As shown in FIG. 1, the first insulation material 33 on the conductive structure 20 may define at least one opening 335 extending through the first insulation material 33 and in communication with the at least one opening 221 of the second passivation layer 22 to expose the exposed portion of the second circuit layer 24, and the at least one interconnection via 42 may be disposed in the at least one opening 335, in the at least one opening 221 and on the exposed portion of the second circuit layer 24. The at least one interconnection via 42 is disposed between the conductive layer 41 (e.g., the metal layer) and the conductive structure 20 for electrically connecting the conductive layer 41 (e.g., the metal layer) and the conductive structure 20 (e.g., the exposed portion of the second circuit layer 24). In some embodiments, the conductive layer 41 (e.g., the metal layer), the at least one interconnection via 42 and the interconnection metal 34 of the at least one via structure 30 may be formed concurrently and integrally. In some embodiments, a portion of the height compensation portion 332 may be between the conductive layer 41 (e.g., the metal layer) and the at least one circuit layer (e.g., the second circuit layer 24) of the conductive structure 20 to increase a distance between the conductive layer 41 (e.g., the metal layer) and the at least one circuit layer (e.g., the second circuit layer 24) of the conductive structure 20. In some embodiments, as shown in FIG. 1, the second insulation material 35 may extend on and cover the conductive layer 41 (e.g., the metal layer). The conductive layer 41 (e.g., the metal layer) may define at least one dimple 412 recessed from a top surface of the conductive layer 41 (e.g., the metal layer), and the second insulation material 35 may cover the at least one dimple 412 of the conductive layer 41 (e.g., the metal layer).

The at least one metal bump 43 is disposed on and electrically connected to the conductive layer 41 (e.g., the metal layer) for external connection. In some embodiments, the second insulation material 35 above the conductive structure 20 may define at least one opening 352 extending through the second insulation material 35 to expose a portion of the conductive layer 41 (e.g., the metal layer), and the at least one metal bump 43 may be disposed in the openings 352 and on the exposed portion of the conductive layer 41 (e.g., the metal layer). Further, the at least one metal bump 43 may protrude from a top surface of the second insulation material 35.

The at least one electrical component 50 may be, for example, a capacitor (e.g., a deep trench capacitor), a resistor or an inductor. The at least one electrical component 50 is disposed in the semiconductor substrate 10 and electrically connected to the conductive structure 20. The at least one electrical component 50 is disposed adjacent to the upper surface 11 of the semiconductor substrate 10. Thus, the upper surface 11 of the semiconductor substrate 10 is an active surface, and the lower surface 12 of the semiconductor substrate 10 is a backside surface. In some embodiments, a distance d1 between the at least one electrical component 50 and the at least one through hole 15 of the semiconductor substrate 10 may be greater than a distance d2 between the at least one electrical component 50 and the at least one opening 25 of the conductive structure 20.

The protection layer 61 covers the lower surface 12 of the semiconductor substrate 10. The protection layer 61 may define at least one opening 612 extending through the protection layer 61 to expose a portion (e.g., a portion of the bottom surface 31) of the at least one via structure 30. As shown in FIG. 1, the exposed portion of the bottom surface 31 includes a portion of the bottom surface of the first insulation material 33 and a bottom surface of the interconnection metal 34.

The at least one connecting pad 62 is disposed in the at least one opening 612 of the protection layer 61 and on the exposed portion (including, for example, the exposed portion of the bottom surface of the first insulation material 33 and the bottom surface of the interconnection metal 34) of the bottom surface 31 of the at least one via structure 30. In some embodiments, as shown in FIG. 1, the protection layer 61 may be disposed between the at least one connecting pad 62 and the lower surface 12 of the semiconductor substrate 10 to prevent the at least one connecting pad 62 from contacting the lower surface 12 of the semiconductor substrate 10, thereby reducing the risk of the leakage of electricity during the reliability test. The at least one connecting pad 62 may be electrically connected to the conductive structure 20 through the interconnection metal 34, the conductive layer 41 (e.g., the metal layer) and the at least one interconnection via 42. The at least one connecting pad 62 may align with the at least one opening 25 of the conductive structure 20. In some embodiments, the at least one connecting pad 62 may overlap the downward projection area of the at least one opening 25 of the conductive structure 20.

Further, the at least one connecting pad 62 may protrude downward from a bottom surface of the protection layer 61.

In the embodiment illustrated in FIG. 1 to FIG. 2, the height compensation portion 332 of the first insulation material 33 may increase the distance between the conductive layer 41 (e.g., the metal layer) and the at least one circuit layer (e.g., the second circuit layer 24) of the conductive structure 20 so as to eliminate the coupling issue between the conductive layer 41 (e.g., the metal layer) and the at least one circuit layer (e.g., the second circuit layer 24) of the conductive structure 20, thereby preventing the leakage current and the parasitic capacitance from being generated between the conductive layer 41 (e.g., the metal layer) and the at least one circuit layer (e.g., the second circuit layer 24) of the conductive structure 20.

Figure 3:
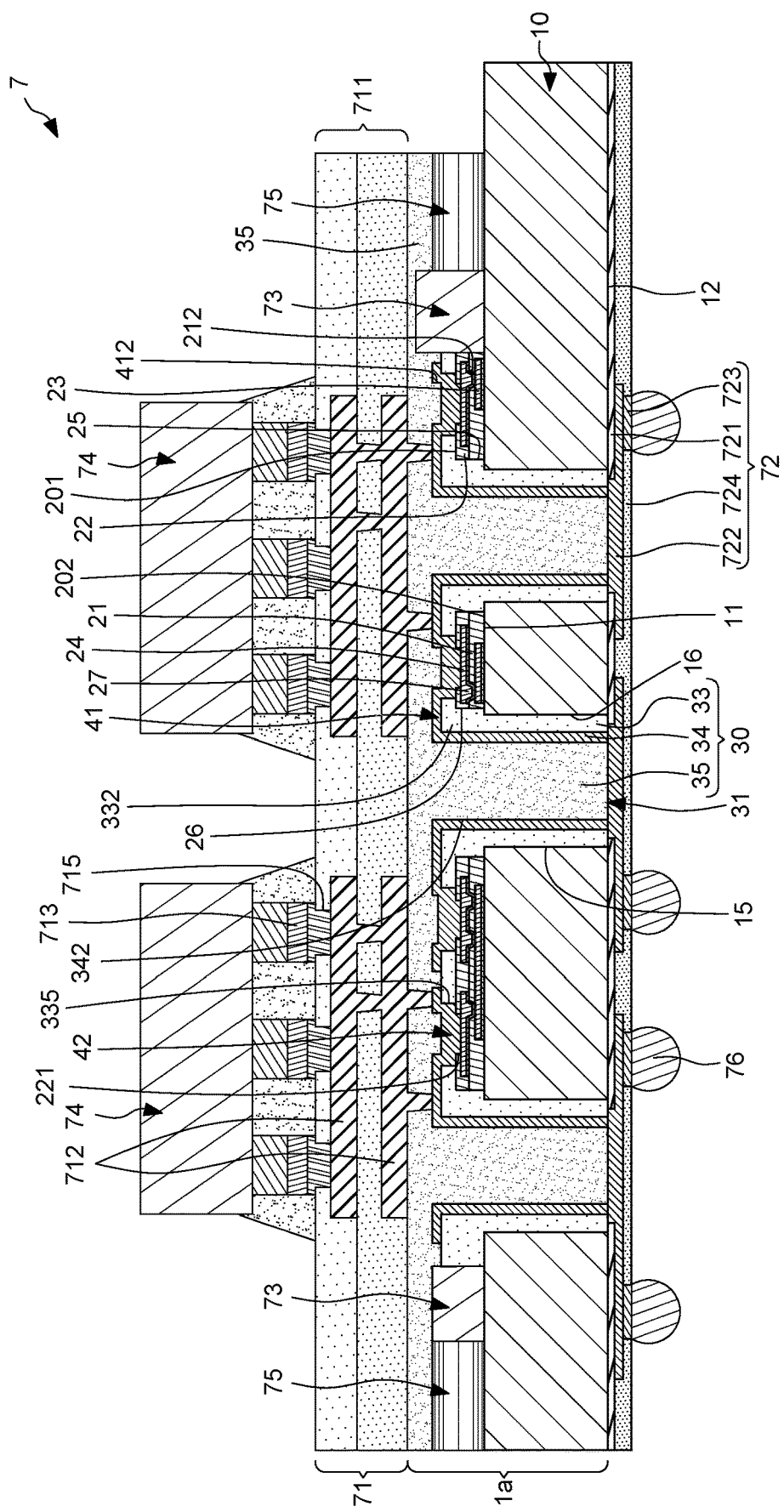
FIG. 3 illustrates a cross-sectional view of an optical communication package structure according to some embodiments of the present disclosure.

FIG. 3 illustrates a cross-sectional view of an optical communication package structure 7 according to some embodiments of the present disclosure. The optical communication package structure 7 includes a semiconductor device 1*a*, a wiring structure 71, a redistribution structure 72, at least one optical device 73, at least one electrical device 74, at least one waveguide 75 and a plurality of solder bumps 76. In some embodiments, the optical communication package structure 7 may be a photonic-electronic hybrid package structure.

The semiconductor device 1*a* is similar to the semiconductor device 1 shown in FIG. 1, except that the at least one metal bump 43, the at least one electrical component 50, the protection layer 61 and the at least one connecting pad 62 are omitted.

The wiring structure 71 is disposed on an upper surface (i.e., the top surface of the second insulation material 35) of the semiconductor device 1*a*. The wiring structure 71 includes a dielectric structure 711, at least one circuit layer 712 and a plurality of metal bumps 713. The dielectric structure 711 covers the upper surface (i.e., the top surface of the second insulation material 35) of the semiconductor device 1*a*, and includes a plurality of dielectric layers stacked on one another. The at least one circuit layer 712 is embedded in the dielectric layers of the dielectric structure 711. In some embodiments, the wiring structure 71 may include a plurality of circuit layers 712 electrically connected to each other through a plurality of inner vias. In addition, the at least one circuit layer 712 may be electrically connected to the conductive layer 41 (e.g., the metal layer) of the semiconductor device 1*a* through the inner vias. The metal bumps 713 are disposed adjacent to an upper surface of the wiring structure 71. As shown in FIG. 3, the metal bumps 713 are disposed on and electrically connected to the topmost circuit layer 712. In some embodiments, the dielectric structure 711 defines a plurality of openings 715 to expose a portion of the topmost circuit layer 712, and the metal bumps 713 may be disposed in the openings 715 and on the topmost circuit layer 712. Further, the metal bumps 713 may protrude from the upper surface of the wiring structure 71.

The redistribution structure 72 is disposed on a lower surface (i.e., the lower surface 12 of the semiconductor substrate 10) of the semiconductor device 1*a* and electrically connected to the at least one via structure 30. The redistribution structure 72 includes a first passivation layer 721, a redistribution layer 722, a plurality of bonding pads 723 and a second passivation layer 724. The first passivation layer 721 is disposed on the lower surface (i.e., the lower surface 12 of the semiconductor substrate 10) of the semiconductor device 1*a*. The redistribution layer 722 is disposed on the first passivation layer 721 and electrically connected to the interconnection metal 34 of the at least one via structure 30. For example, the redistribution layer 722 may be formed from copper or alloy. The bonding pads 723 are disposed on and electrically connected to the redistribution layer 722. The second passivation layer 724 covers the redistribution layer 722 and the first passivation layer 721.

The optical device 73 may be, for example, a photo detector, a laser diode or a modulator. The optical device 73 is disposed adjacent to the upper surface (i.e., the top surface of the second insulation material 35) of the semiconductor device 1*a*. In some embodiments, the second insulation material 35 of the at least one via structure 30 may cover the optical device 73. In some embodiments, the optical device 73 may be disposed adjacent to the boundary between the wiring structure 71 and the semiconductor device 1*a*.

The electrical device 74 may be, for example, a transimpedance amplifier (TIA) or a driver. The electrical device 74 is disposed on and electrically connected to the wiring structure 71 by flip-chip bonding. In some embodiments, the electrical device 74 may be bonded to the metal bumps 713 of the wiring structure 71. In some embodiments, the electrical device 74 may perform vertical electrical connection through the at least one via structure 30 and the redistribution structure 72, thereby resulting in an increase in transmission speed while power consumption may be decreased. This is due to the at least one via structure 30 and the redistribution structure 72 shorten the electric transmission path. In addition, the at least one via structure 30 and the redistribution structure 72 may reduce a volume of the optical communication package structure 7 about 30%.

The waveguide 75 is disposed adjacent to the upper surface (i.e., the top surface of the second insulation material 35) of the semiconductor device 1*a* and corresponds to the optical device 73. In some embodiments, the second insulation material 35 of the at least one via structure 30 may cover the waveguide 75. An end of the waveguide 75 may be exposed from a lateral side surface of the dielectric structure 711 of the wiring structure 71.

The solder bumps 76 (e.g., solder balls) are mounted on the bonding pads 723 of the redistribution structure 72 for external connection.

Figure 4:
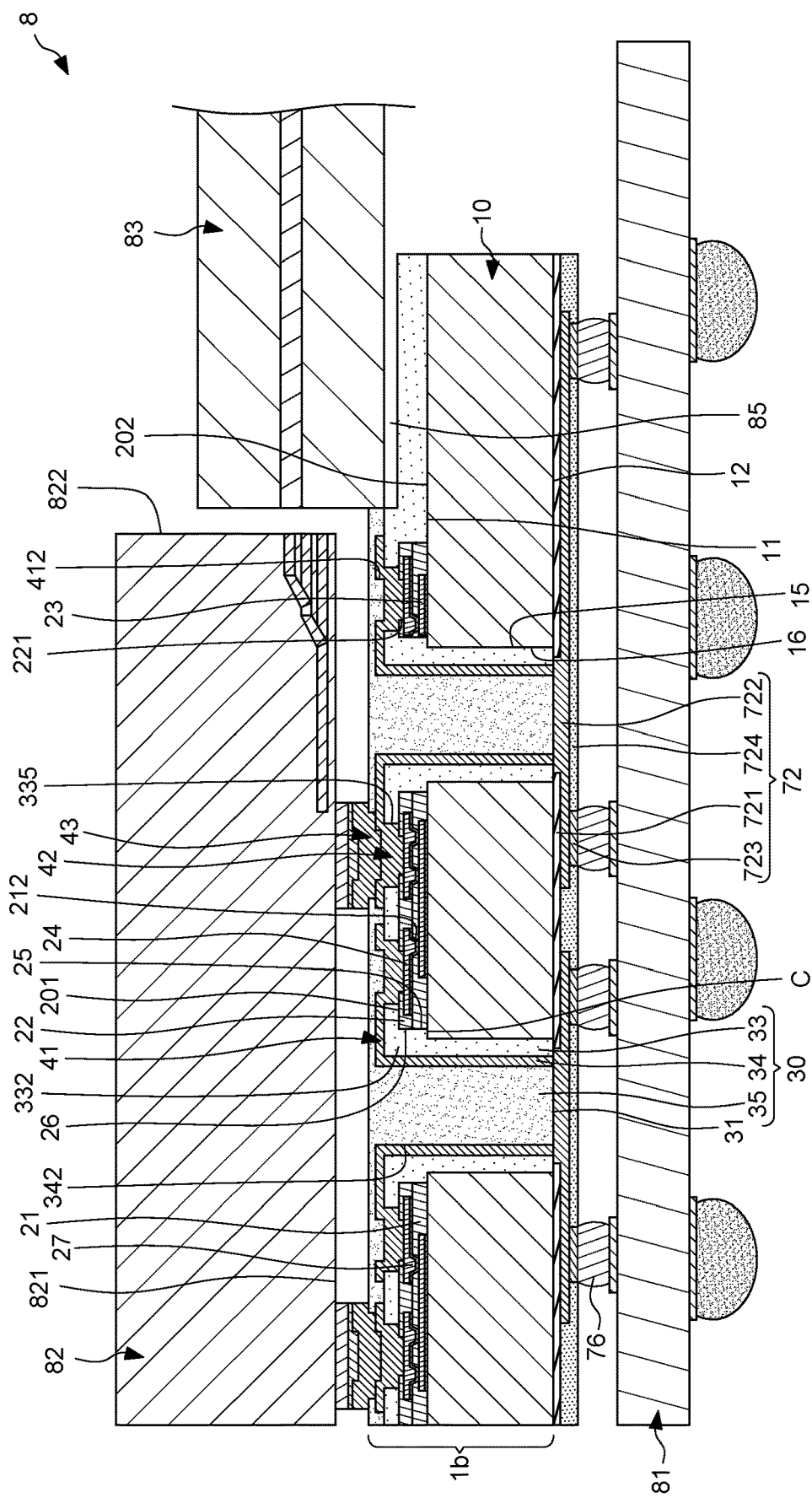
FIG. 4 illustrates a cross-sectional view of an optoelectronic structure according to some embodiments of the present disclosure.

FIG. 4 illustrates a cross-sectional view of an optoelectronic structure 8 according to some embodiments of the present disclosure. The optoelectronic structure 8 includes a substrate 81, a semiconductor device 1*b* and a photonic die 82. The substrate 81 may include a conductive substrate with circuitry formed therein. The substrate 81 may be electrically connected to the semiconductor device 1*b*, and configured to build an electrical connection to an external electronic component such as a printed circuit board (PCB). The semiconductor device 1*b* is similar to the semiconductor device 1*a* shown in FIG. 3, except that the semiconductor device 1*b* further includes the at least one metal bump 43 of FIG. 1. In some embodiments, the semiconductor device 1*b* receives power from the substrate 81 and then provides a driving signal to the photonic die 82. The semiconductor device 1*b* is disposed on the substrate 81 and may define at least one groove 85 to support and position an optical component 83. The optical component 83 may be, for example, an optical fiber. The photonic die 82 is disposed on and electrically connected to the semiconductor device 1*b* (e.g., the at least one metal bump 43), and has an active surface 821 toward the semiconductor device 1*b* and a side surface 822 facing the optical component 83. In some embodiments, a light signal from the optical component 83 may be coupled to the side surface 822 of the photonic die 82. Then, the light signal can be converted into a current signal by the photonic die 82.

FIG. 5 through FIG. 12 illustrate a method for manufacturing a semiconductor device according to some embodiments of the present disclosure. In some embodiments, the method is for manufacturing a semiconductor device such as the semiconductor device 1 shown in FIG. 1.

Figure 5:
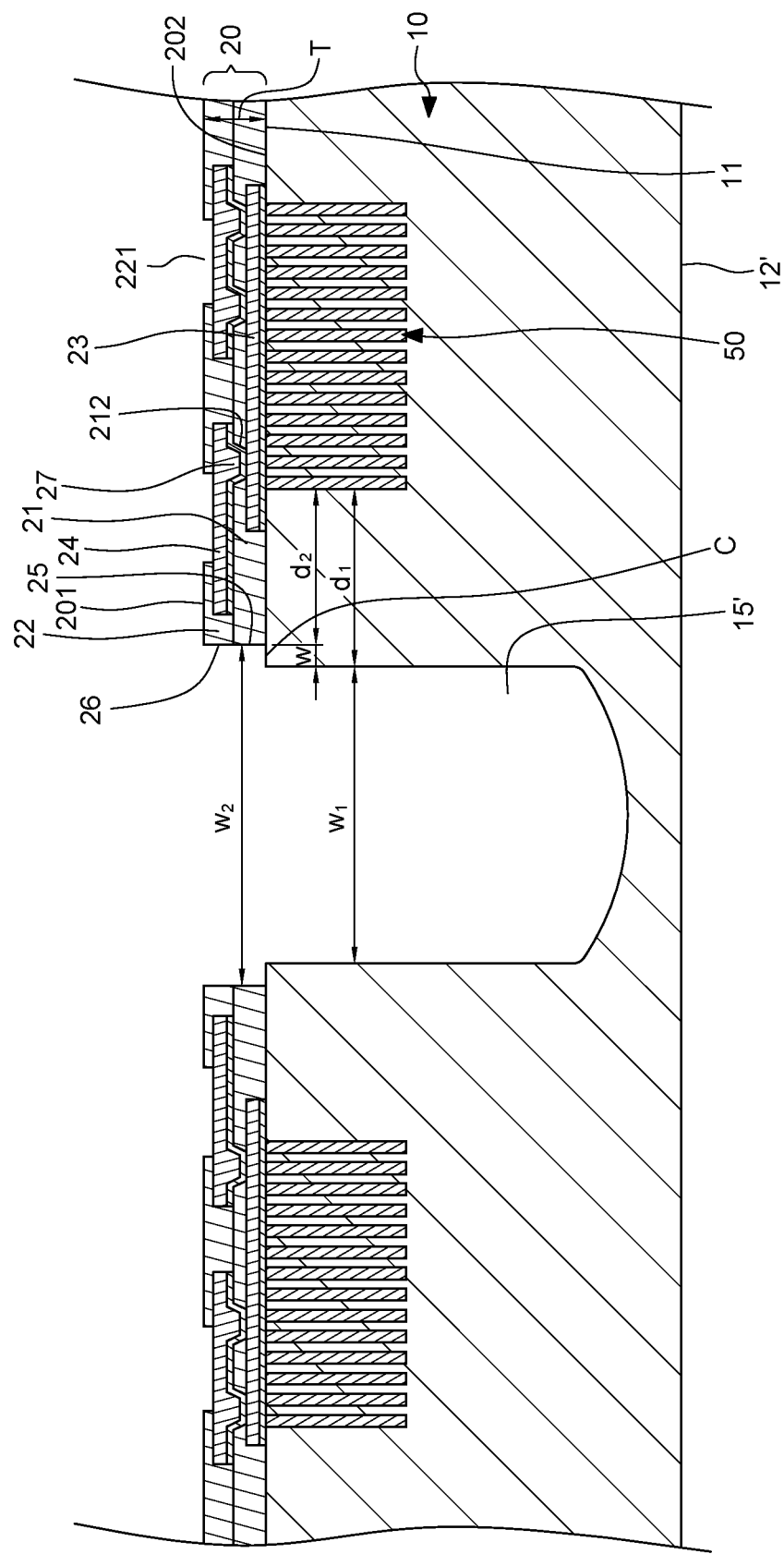
FIG. 5 illustrates one or more stages of an example of a method for manufacturing a semiconductor device according to some embodiments of the present disclosure.
Figure 5A:
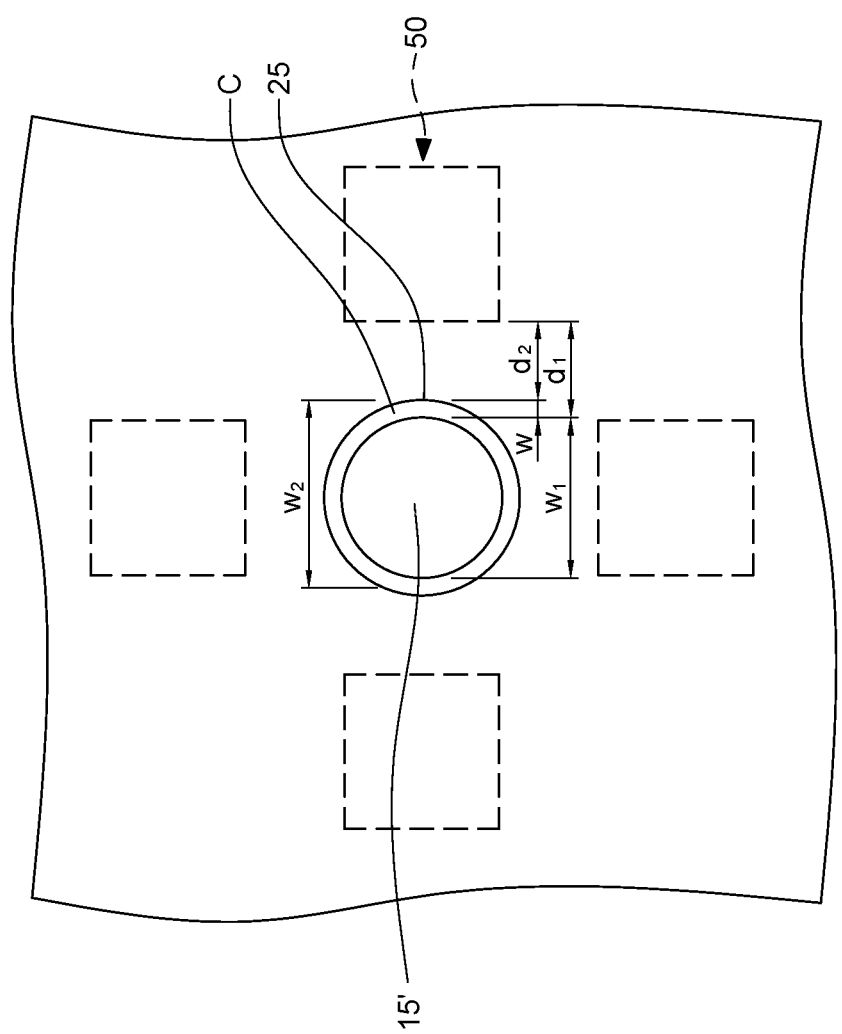
FIG. 5A illustrates a top view of FIG. 5.

Referring to FIG. 5 and FIG. 5A, wherein FIG. 5A is a top view of FIG. 5, a semiconductor substrate 10 and a conductive structure 20 are provided. The semiconductor substrate 10 of FIG. 5 may be the same as the semiconductor substrate 10 of FIG. 1. The semiconductor substrate 10 has an upper surface 11 and a lower surface 12' opposite to the upper surface 11. At least one electrical component 50 may be formed in the semiconductor substrate 10 and adjacent to the upper surface 11 of the semiconductor substrate 10. The conductive structure 20 is disposed on the upper surface 11 of the semiconductor substrate 10 to electrically connect the electrical component 50. The conductive structure 20 of FIG. 5 may be the same as the conductive structure 20 of FIG. 1. At least one blind hole 15' is formed in the semiconductor substrate 10 from the upper surface 11 and at least one opening 25 is formed to extend through the conductive structure 20 by one etching process (e.g., one deep reactive-ion etching process). Thus, the at least one opening 25 is in communication with the at least one blind hole 15'.

In some embodiments, as shown in FIG. 5A, a distance di between the at least one electrical component 50 and the at least one blind hole 15' may be greater than a distance d2 between the at least one electrical component 50 and the at least one opening 25.

Figure 6:
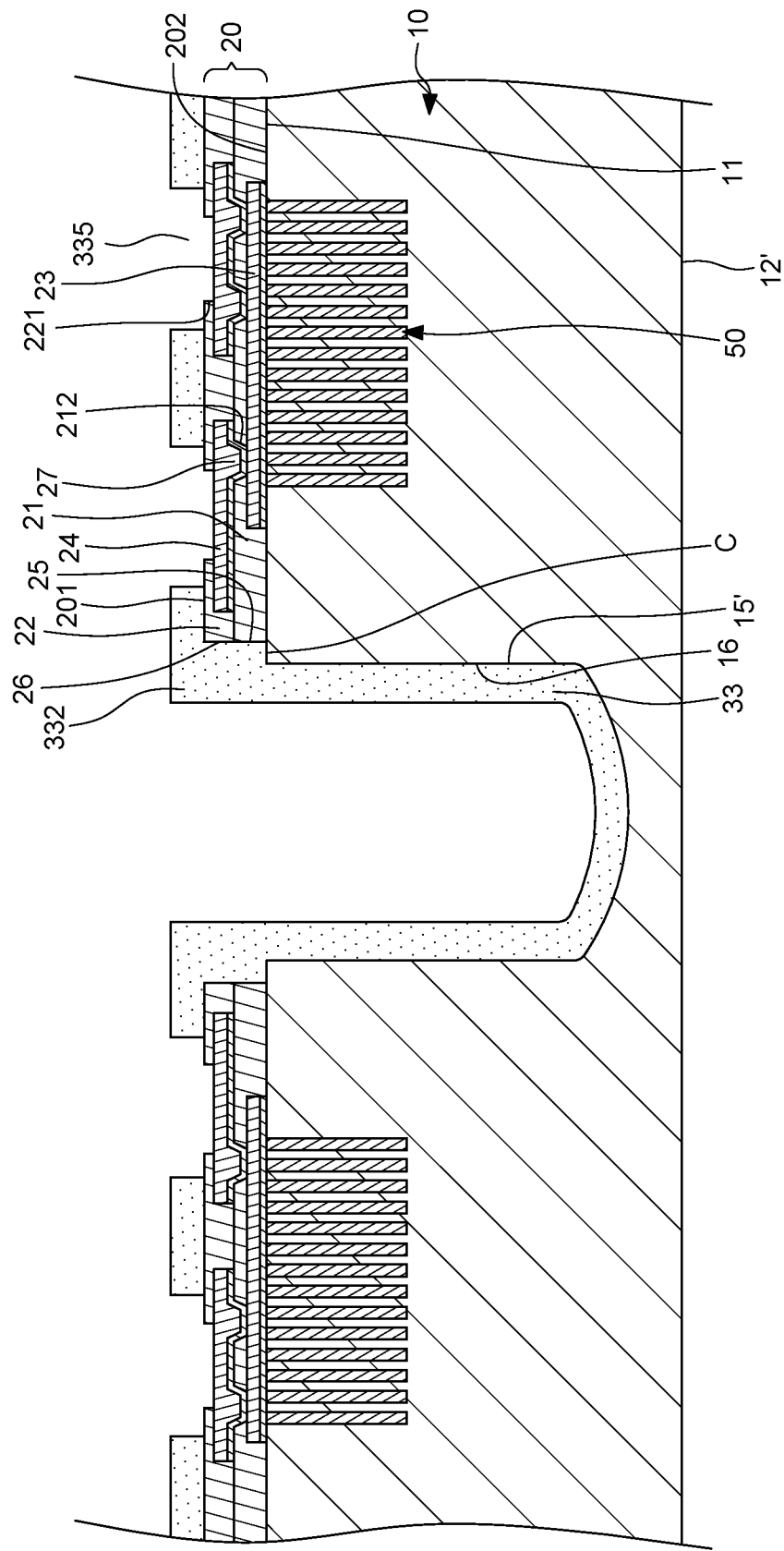
FIG. 6 illustrates one or more stages of an example of a method for manufacturing a semiconductor device according to some embodiments of the present disclosure.
Figure 7:
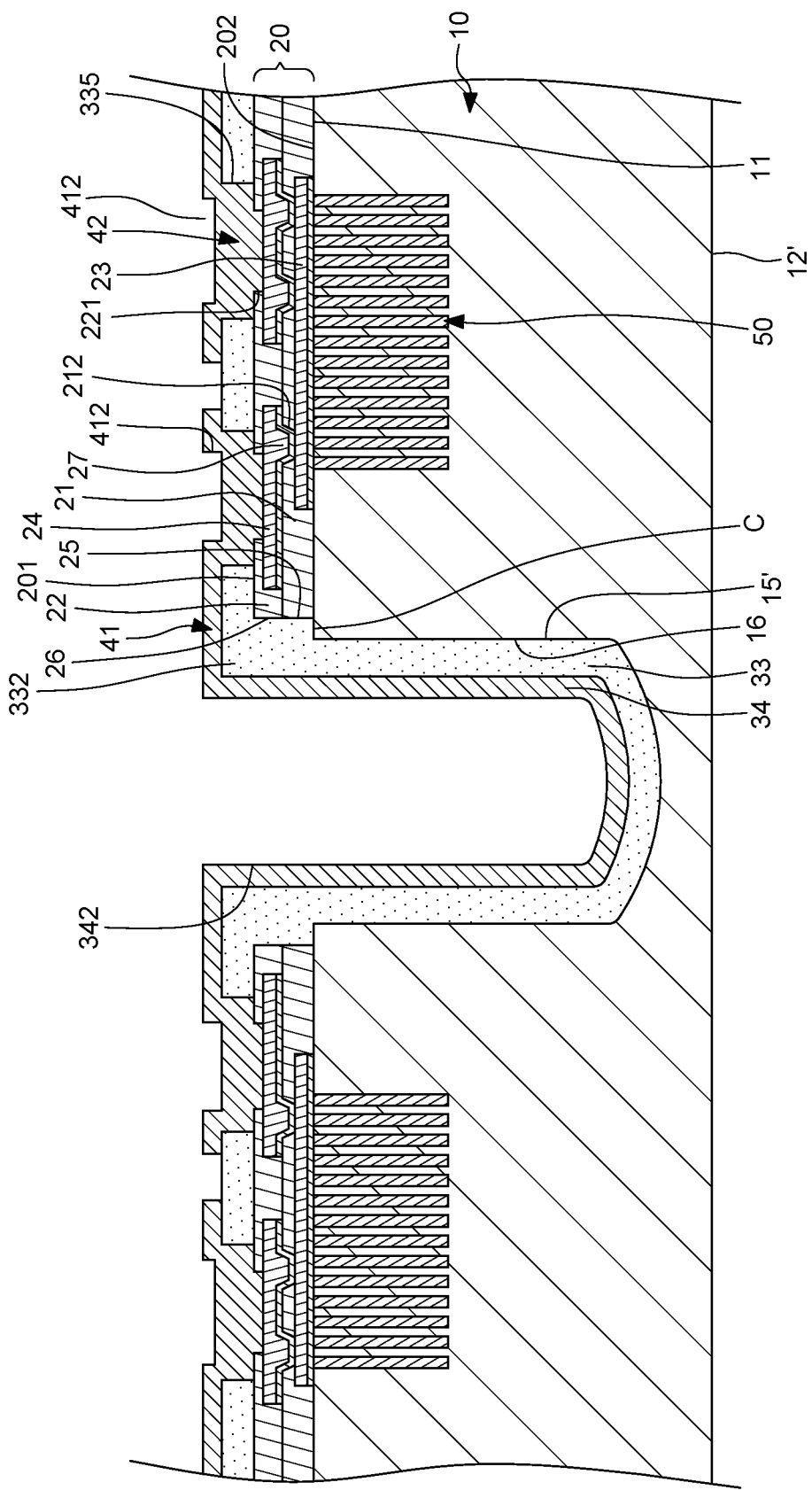
FIG. 7 illustrates one or more stages of an example of a method for manufacturing a semiconductor device according to some embodiments of the present disclosure.
Figure 8:
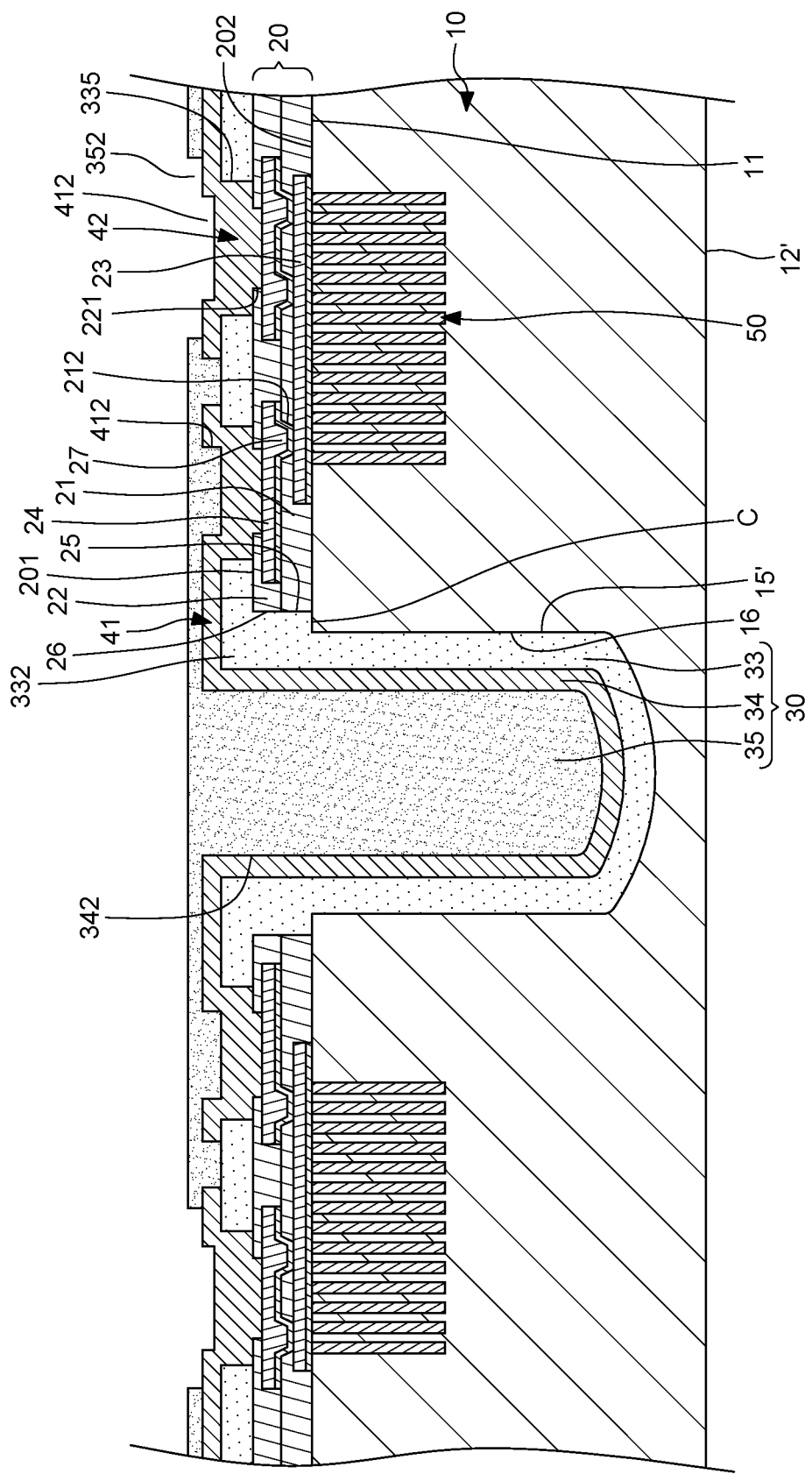
FIG. 8 illustrates one or more stages of an example of a method for manufacturing a semiconductor device according to some embodiments of the present disclosure.

Referring to FIG. 6 through FIG. 8, at least one via structure 30 is formed in the semiconductor substrate 10 and extends beyond the conductive structure 20. Referring to FIG. 6, a first insulation material 33 is formed in the at least one blind hole 15' of the semiconductor substrate 10, in the at least one opening 25 of the conductive structure 20 and on the top surface 201 of the conductive structure 20 by, for example, vacuum suction or chemical vapor deposition (CVD). The first insulation material 33 may be a dry film (attached by vacuum suction), a silicon oxide (formed by CVD), a silicon nitride (formed by CVD), polyimide (PI), polyamide (PA), or polypropylene (PP). The first insulation material 33 includes a height compensation portion 332 protruding from the upper surface 11 of the semiconductor substrate 10. The height compensation portion 332 may contact and cover the exposed portion of the upper surface 11 of the semiconductor substrate 10, and may cover the inner wall 26 of the at least one opening 25 of the conductive structure 20. That is, the height compensation portion 332 may cover the recession C. In addition, at least one opening 335 may be formed to extend through the first insulation material 33 on the conductive structure 20 and in communication with the at least one opening 221 of the second passivation layer 22 to expose the exposed portion of the second circuit layer 24.

Referring to FIG. 7, a conductive material is formed or disposed by, for example, electroplating. The conductive material on the first insulation material 33 in the blind hole 15' and on the side of the height compensation portion 332 is defined as an interconnection metal 34. The conductive material on the top surface of the height compensation portion 332 and on the first insulation material 33 on the conductive structure 20 is defined as a conductive layer 41. The conductive material in the at least one openings 335 of the first insulation material 33, in the at least one opening 221 of the second passivation layer 22 and on the exposed portion of the second circuit layer 24 is defined as an interconnection via 42 In some embodiments, a portion of the interconnection metal 34 on the first insulation material 33 may define a central hole 342. In addition, a plurality of dimples 412 are formed on the conductive layer 41 (e.g., the metal layer). The dimples 412 are recessed from a top surface of the conductive layer 41 (e.g., the metal layer).

Referring to FIG. 8, a second insulation material 35 is formed on the interconnection metal 34 and the conductive layer 41 (e.g., the metal layer) by, for example, vacuum suction. The second insulation material 35 may be a dry film, a silicon oxide, a silicon nitride, polyimide (PI), polyamide (PA), or polypropylene (PP). The second insulation material 35 may fill the central hole 342 defined by the interconnection metal 34 and cover the dimples 412 of the conductive layer 41 (e.g., the metal layer). Meanwhile, at least one via structure 30 (including the first insulation material 33, the interconnection metal 34 and the second insulation material 35) is formed. The material of the second insulation material 35 may be same as or different from the material of the first insulation material 33.

In addition, the second insulation material 35 on the conductive layer 41 may further define at least one opening 352 to expose a portion (e.g., one of the dimples 412) of the conductive layer 41 (e.g., the metal layer).

Figure 9:
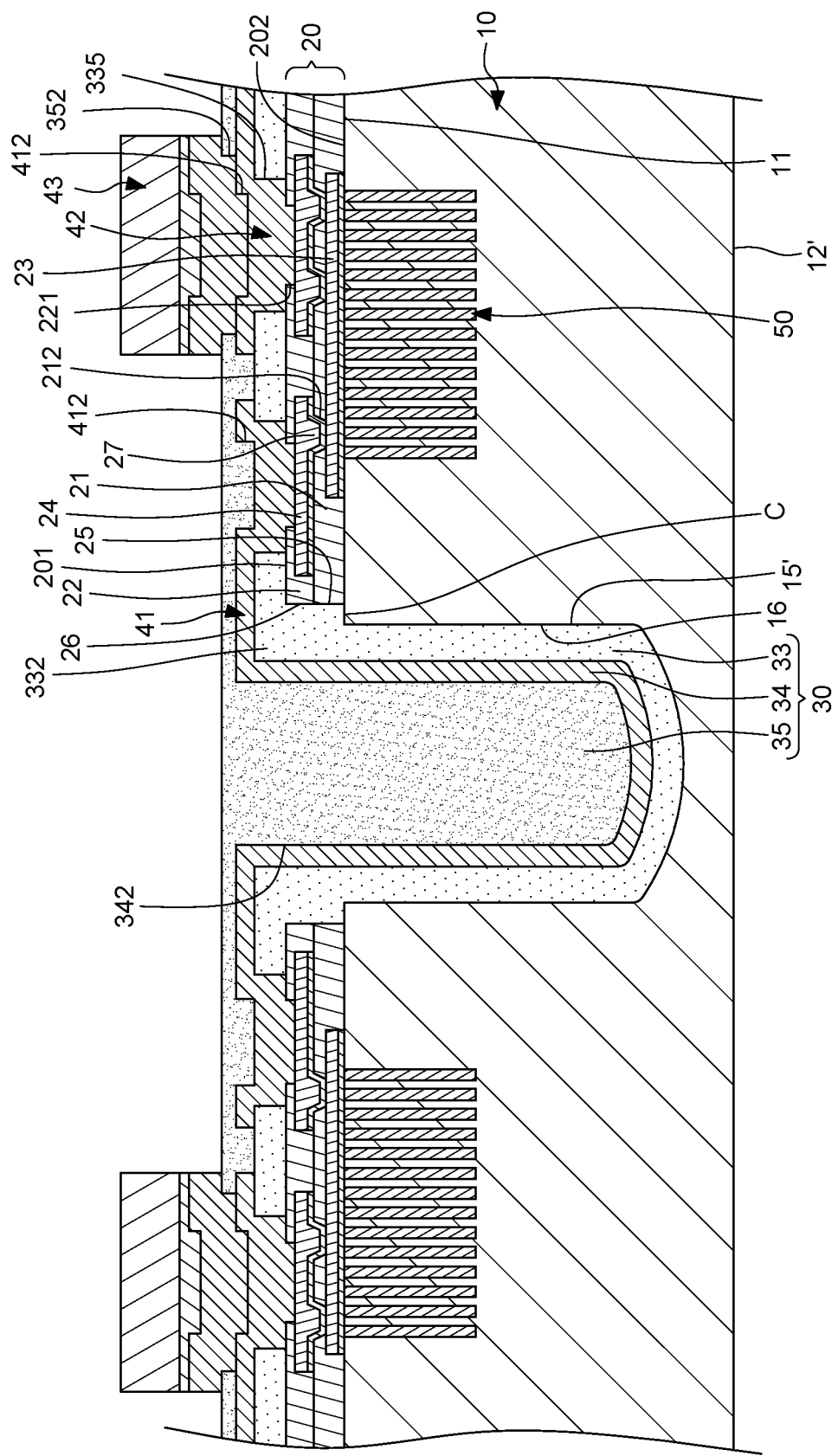
FIG. 9 illustrates one or more stages of an example of a method for manufacturing a semiconductor device according to some embodiments of the present disclosure.

Referring to FIG. 9, at least one metal bump 43 is formed in the opening 352 and on the exposed portion of the conductive layer 41 (e.g., the metal layer).

Figure 10:
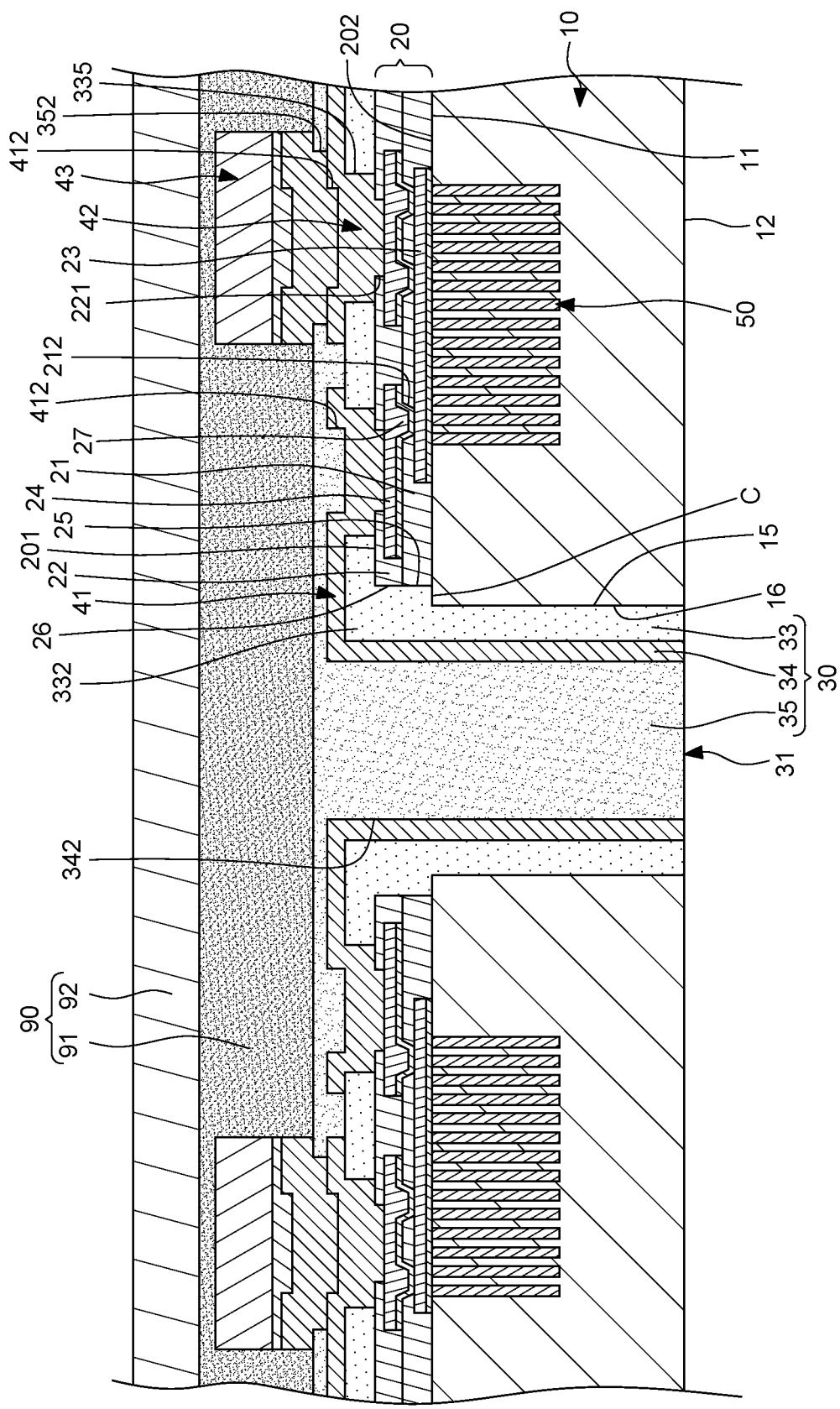
FIG. 10 illustrates one or more stages of an example of a method for manufacturing a semiconductor device according to some embodiments of the present disclosure.

Referring to FIG. 10, the structure (including the at least one via structure 30 on the semiconductor substrate 10) of FIG. 9 is disposed on a carrier structure 90. In some embodiments, the carrier structure 90 may include a glass substrate 92 and an adhesive 91. The structure of FIG. 9 is attached to the glass substrate 92 through the adhesive 91. That is, the at least one via structure 30 (e.g., the second insulation material 35) and the metal bump 43 are attached to the glass substrate 92 through the adhesive 91. Then, the semiconductor substrate 10 is thinned from the lower surface 12' of the semiconductor substrate 10 to expose a portion of the at least one via structure 30 by, for example, grinding or chemical mechanical planarization (CMP).

Forming the at least one vias structure 30 in advance may improve the structural strength of the semiconductor substrate 10 so as to prevent the semiconductor substrate 10 from cracking during the grinding process or chemical mechanical planarization (CMP) process. Therefore, the yield of the semiconductor device 1 (FIG. 1) is improved.

The exposed portion (e.g., a bottom surface 31) of the at least one via structure 30 includes a bottom surface of the first insulation material 33, a bottom surface of the interconnection metal 34 and a bottom surface of the second insulation material 35. In some embodiments, the bottom surface of the first insulation material 33, the bottom surface of the interconnection metal 34 and the bottom surface of the second insulation material 35 are substantially coplanar with a lower surface 12 of the semiconductor substrate 10.

Figure 11:
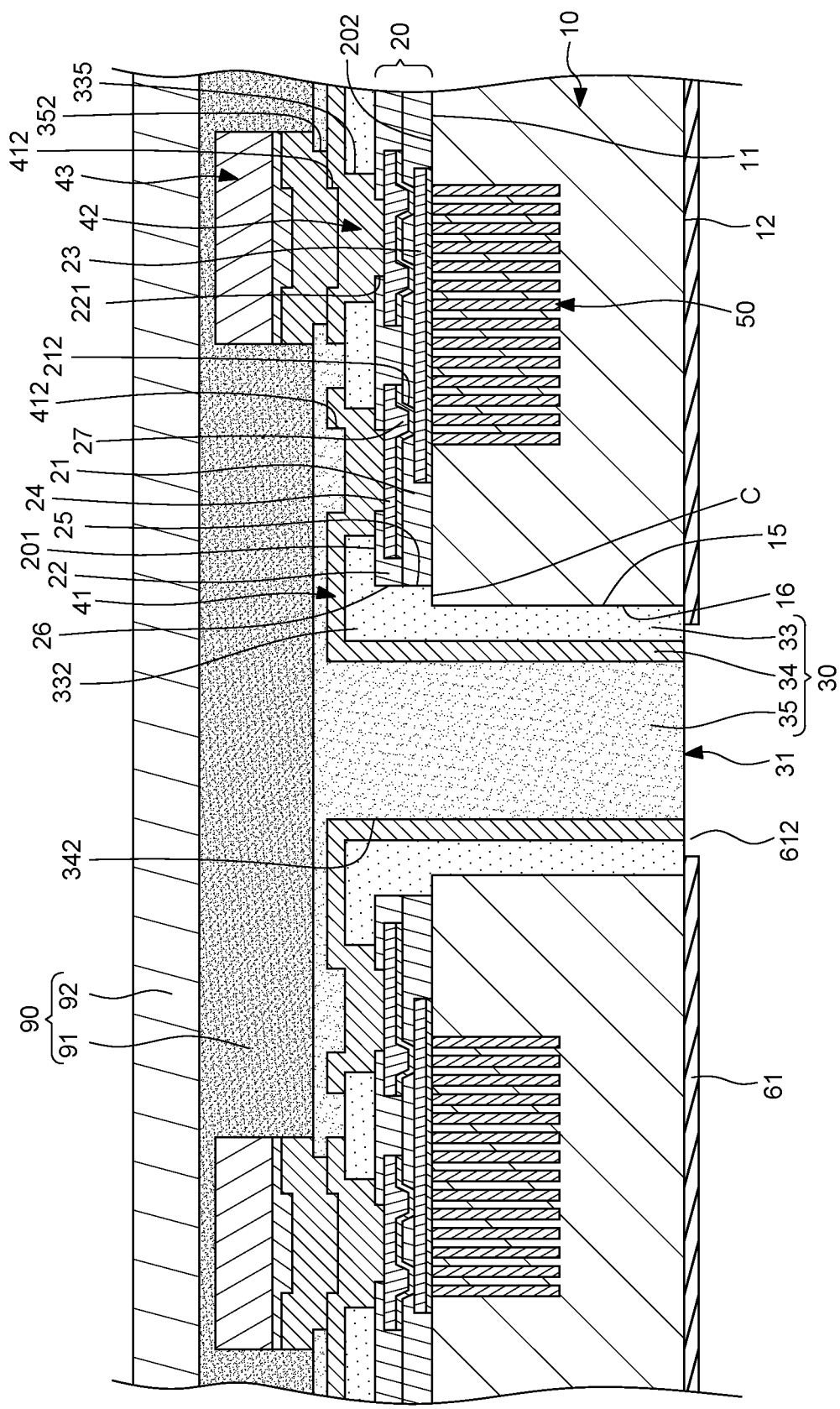
FIG. 11 illustrates one or more stages of an example of a method for manufacturing a semiconductor device according to some embodiments of the present disclosure.

Referring to FIG. 11, a protection layer 61 is formed on the lower surface 12 of the semiconductor substrate 10 and on a portion of the bottom surface of the first insulation material 33. The protection layer 61 may define at least one opening 612 extending through the protection layer 61 to expose the bottom surface of the interconnection metal 34 and the bottom surface of the second insulation material 35. The at least one opening 612 may further expose a portion of the bottom surface of the first insulation material 33.

Figure 12:
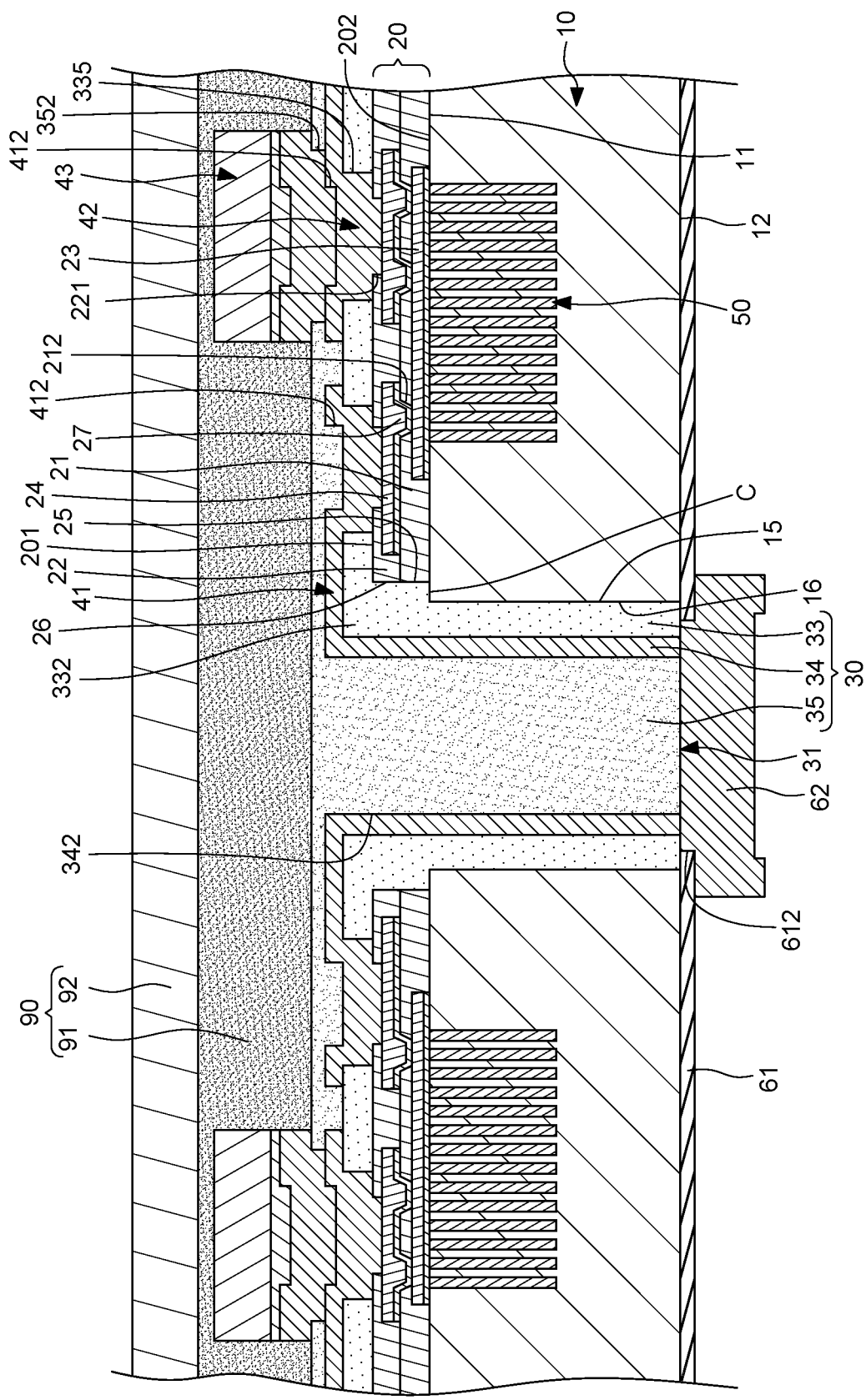
FIG. 12 illustrates one or more stages of an example of a method for manufacturing a semiconductor device according to some embodiments of the present disclosure.

Referring to FIG. 12, at least one connecting pad 62 is formed in the at least one opening 612 of the protection layer 61 and on the exposed portion (including, for example, the exposed portion of the bottom surface of the first insulation material 33, the bottom surface of the interconnection metal 34 and the bottom surface of the second insulation material 35) of the at least one via structure 30. In some embodiments, as shown in FIG. 12, a portion of the protection layer 61 may be disposed between the at least one connecting pad 62 and the lower surface 12 of the semiconductor substrate 10 to prevent the at least one connecting pad 62 from contacting the lower surface 12 of the semiconductor substrate 10. It is noted that the connecting pad 62 may be a portion of a circuit layer on the protection layer 61.

Then, the carrier structure 90 (including the glass substrate 92 and the adhesive 91) is removed to obtain the semiconductor devices 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a semiconductor substrate;
   a conductive structure disposed on an upper surface of the semiconductor substrate, and defining at least one opening extending through the conductive structure, wherein the at least one opening exposes a portion of the upper surface of the semiconductor substrate; and
   at least one via structure disposed in the semiconductor substrate, and including an insulation material extending through the semiconductor substrate, wherein a portion of the at least one via structure extends beyond the conductive structure, and the insulation material includes a height compensation portion covering the exposed portion of the upper surface of the semiconductor substrate.

2. The semiconductor device of claim 1, wherein the exposed portion of the upper surface of the semiconductor substrate and an inner wall of the at least one opening of the conductive structure define a recession, and the height compensation portion covers the recession.

3. The semiconductor device of claim 2, wherein a width of the recession is about 1 µm to about 3 µm.

4. The semiconductor device of claim 2, wherein the conductive structure includes at least one circuit layer spaced apart from the recession.

5. The semiconductor device of claim 1, wherein the height compensation portion extends on a top surface of the conductive structure.

6. The semiconductor device of claim 1, further comprising a conductive layer disposed on the height compensation portion to electrically connect an interconnection metal of the at least one via structure and the conductive structure.

7. The semiconductor device of claim 6, wherein the conductive layer and the interconnection metal of the at least one via structure are formed integrally.

8. The semiconductor device of claim 1, further comprising at least one connecting pad disposed on a bottom surface of the at least one via structure and a protection layer disposed between the at least one connecting pad and a lower surface of the semiconductor substrate.

9. The semiconductor device of claim 1, wherein a bottom surface of the at least one via structure is substantially coplanar with a lower surface of the semiconductor substrate.

10. A semiconductor device, comprising:
a semiconductor substrate defining at least one through hole extending through the semiconductor substrate;
a conductive structure disposed on an upper surface of the semiconductor substrate, and defining at least one opening extending through the conductive structure and in communication with the at least one through hole of the semiconductor substrate, wherein a width of the at least one opening of the conductive structure is greater than a width of the at least one through hole of the semiconductor substrate, and the at least one opening of the conductive structure exposes a portion of the upper surface of the semiconductor substrate; and
at least one via structure disposed in the at least one through hole of the semiconductor substrate, and including an insulation material extending through the semiconductor substrate, wherein the insulation material includes a height compensation portion covering the exposed portion of the upper surface of the semiconductor substrate.

11. The semiconductor device of claim 10, wherein the exposed portion of the upper surface of the semiconductor substrate and an inner wall of the at least one opening of the conductive structure define a recession, and the height compensation portion covers the recession.

12. The semiconductor device of claim 11, wherein the conductive structure includes at least one circuit layer spaced apart from the recession.

13. The semiconductor device of claim 10, wherein the height compensation portion extends on a top surface of the conductive structure.

14. The semiconductor device of claim 10, wherein the at least one via structure is further disposed in the at least one opening of the conductive structure.

15. A semiconductor device, comprising:
a semiconductor substrate;
a conductive structure disposed on an upper surface of the semiconductor substrate, and defining an opening exposing a portion of the upper surface of the semiconductor substrate; and
a via structure disposed in the semiconductor substrate, and including an insulation material extending through the semiconductor substrate and covering the exposed portion of the upper surface of the semiconductor substrate.

16. The semiconductor device of claim 15, wherein a portion of the via structure extends beyond the conductive structure.

* * * * *